United States Patent
Matoba et al.

(10) Patent No.: US 8,497,695 B2
(45) Date of Patent: Jul. 30, 2013

(54) SEMICONDUCTOR DEVICE WITH FAULT DETECTION FUNCTION

(75) Inventors: Chiaki Matoba, Tenri (JP); Kei Kobayashi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 1229 days.

(21) Appl. No.: 12/227,441

(22) PCT Filed: Jun. 13, 2007

(86) PCT No.: PCT/JP2007/061882
§ 371 (c)(1),
(2), (4) Date: Nov. 18, 2008

(87) PCT Pub. No.: WO2008/004414
PCT Pub. Date: Jan. 10, 2008

(65) Prior Publication Data
US 2009/0174426 A1    Jul. 9, 2009

(30) Foreign Application Priority Data
Jul. 7, 2006   (JP) ................................. 2006-188654
Apr. 10, 2007  (JP) ................................. 2007-103322

(51) Int. Cl.
*G01R 31/3187* (2006.01)
(52) U.S. Cl.
USPC ..................... 324/750.3; 324/762.01; 257/48; 438/18
(58) Field of Classification Search
USPC ...... 324/522, 525, 762.01, 750.3; 438/14–18; 257/48, 758
See application file for complete search history.

(56) References Cited

U.S. PATENT DOCUMENTS
4,356,379 A * 10/1982 Graeme ......................... 219/209
7,034,560 B2 * 4/2006 Farnworth et al. ......... 324/750.3
(Continued)

FOREIGN PATENT DOCUMENTS
JP    3-1439    1/1991
JP    5-95039   4/1993
(Continued)

OTHER PUBLICATIONS
M. Matsumoto et al., "Wafer-level Chip Scale Package", Fujikara Tech. Rev., Oct. 2000, pp. 77-80, vol. 99.

*Primary Examiner* — Arleen M Vazquez
(74) *Attorney, Agent, or Firm* — Harness, Dickey & Pierce, P.L.C.

(57) ABSTRACT

A semiconductor device (1) detecting damage to the peripheral part of a chip which could potentially grow into a defect includes: a wire (3) formed along the outer periphery of a semiconductor chip (2*d*) to detect damage; a detection circuit (4) provided in the semiconductor chip (2) to supply a detection signal to the wire (3) to detect a break in the wire (3); an output terminal (5) for outputting the detection signal having passed through the wire (3); an internal circuit (6) provided in the semiconductor chip (2); an output switching circuit (7) selecting either an output signal of the internal circuit (6) or the detection signal having passed the wire (3) for output to the output terminal (5); a heating element (15*a*) heating the peripheral part of the chip; a power supply circuit (16) supplying power to the heating element; and a temperature detection/control circuit (17) controlling the heating by the heating element. This configuration enables easy detection of damage to the chip by logic test without additional measurement terminals. The configuration also enables detection of chips which could develop a defect when packaged.

12 Claims, 12 Drawing Sheets

U.S. PATENT DOCUMENTS

| | | | |
|---|---|---|---|
| 7,557,597 B2 * | 7/2009 | Anderson et al. | 324/750.3 |
| 7,952,371 B2 * | 5/2011 | Nagasawa | 324/750.3 |
| 8,093,923 B2 * | 1/2012 | Shimizu | 326/102 |
| 2004/0113661 A1 * | 6/2004 | Kinoshita et al. | 327/74 |
| 2005/0212147 A1 * | 9/2005 | Nishizawa | 257/786 |
| 2006/0189007 A1 * | 8/2006 | Aoki et al. | 438/14 |
| 2007/0023915 A1 * | 2/2007 | Jao et al. | 257/758 |
| 2008/0012572 A1 * | 1/2008 | Tsukuda | 324/522 |

FOREIGN PATENT DOCUMENTS

| | | |
|---|---|---|
| JP | 6-97245 | 4/1994 |
| JP | 7-193108 | 7/1995 |
| JP | 2000-040724 | 2/2000 |
| JP | 2000-138245 | 5/2000 |
| JP | 2002-26232 | 1/2002 |
| JP | 2005-172467 | 6/2005 |
| JP | 2005-277338 | 10/2005 |

* cited by examiner

SEMICONDUCTOR DEVICE WITH FAULT DETECTION FUNCTION

TECHNICAL FIELD

The present invention relates to semiconductor devices which have a function of detecting damage and breakage of chips.

BACKGROUND ART

A semiconductor packaging technology called chip scale package ("CSP") is rapidly gaining popularity. In CSP technology, each chip is "rewired" connecting the electrodes on the chip to a matrix of solder bumps on a package surface. With this configuration, the semiconductor packaging is freed from the layout of the element electrodes arranged with narrow pitches on the semiconductor chip and can be made in a very compact size (almost the same size as the chip).

A technique in CSP, called a wafer level CSP process, is a manufacturing method by which semiconductor devices are fabricated without dicing the wafer into chips up to packaging. In wafer level CSP, the entire structure conventionally required for packaging, including solder bump terminal, is built across the wafer surface, that is, simultaneously for all the chips. The finished wafer, now having solder bumps across its surface, is diced to obtain the same packaged semiconductor devices as conventional ones.

The chips fabricated on a semiconductor wafer in wafer level CSP are cut physically into individual chips, for example, with a dicing device. See, for example, non-patent document 1.

Figure 10:
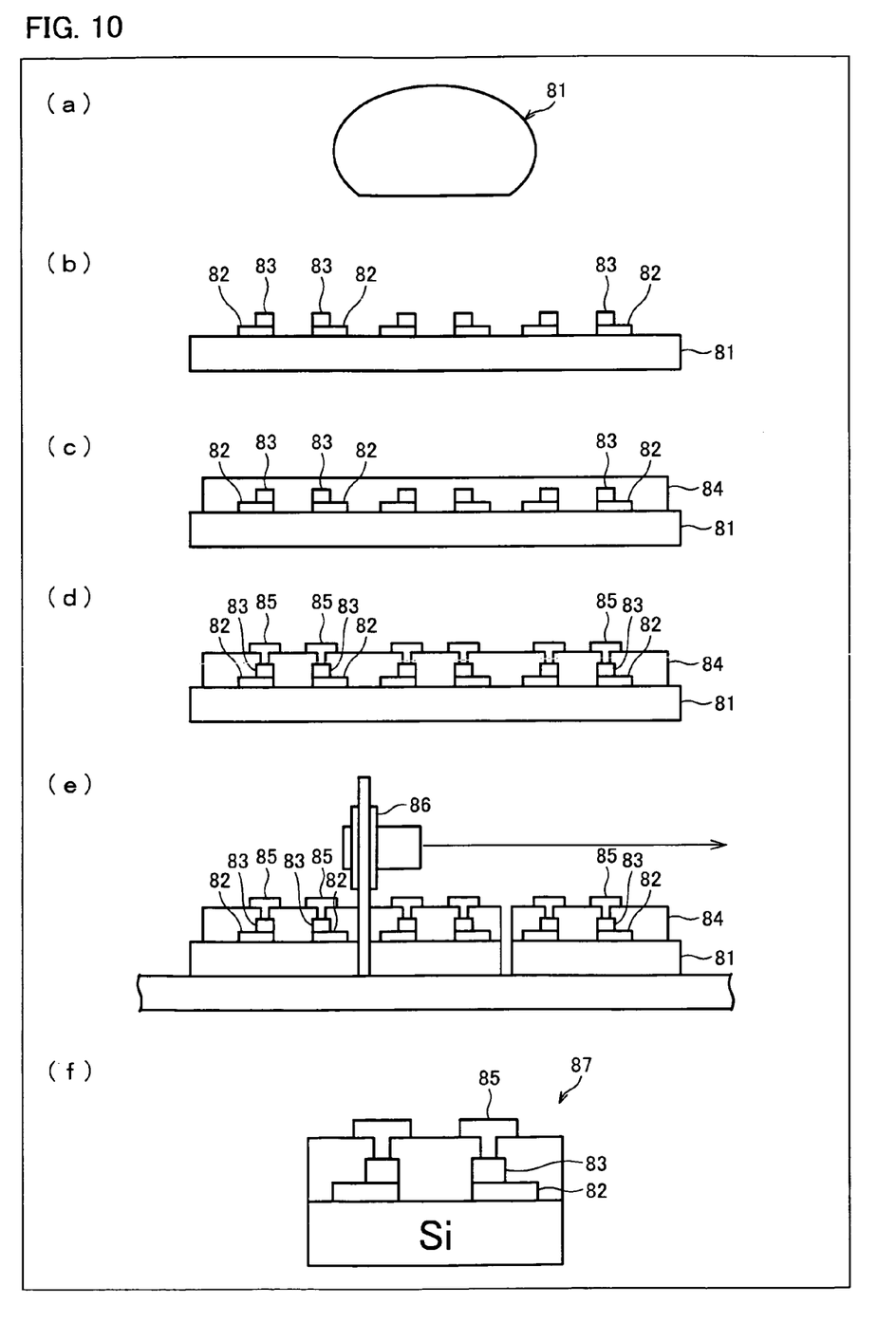
FIG. 10 Drawings illustrating a manufacturing method for wafer level CSPs: (a) to (f) showing individual steps.

FIG. 10 illustrates a wafer level CSP manufacturing method, showing individual steps in (a) to (f). Referring to (a) and (b) of FIG. 10, first of all, posts 83 are formed on a semiconductor wafer 81 to allow wires to be drawn from aluminum electrodes 82 on the semiconductor wafer 81. Then, the semiconductor wafer 81 is sealed with resin 84 as shown in (c) of FIG. 10. Next, as in (d) of FIG. 10, terminals 85 are provided on the seal resin 84 so as to connect to the posts 83. Thereafter, the semiconductor wafer 81 is diced with a dicing device 86 as shown in (e) of FIG. 10, to obtain individual chips 87 shown in (f) of FIG. 10.

The illustrated method provides no protection film on the side faces of the packages in structural design, making the wafer level CSPs vulnerable to mechanical impact. This problem is addressed, for example, in patent document 1 by forming a protective resin layer on the side faces of the wafer level CSPs for reinforcement.

As would be understood from the description above, the wafer level CSPs are vulnerable to mechanical impact and could be damaged when cut into individual packages in manufacture. For example, external parts of the packages may break away or crack. If the damage is critical, it will seriously affect chip circuitry and be detected later by inspection. On the other hand, if the damage is of a minor nature and does not affect the circuitry, it will not be detected. Nevertheless, even minor damage can spread under thermal or impact-induced stress after the package is mounted on a circuit board and potentially affect circuit operation. Therefore, it is desirable if minor damage can be detected in inspection.

Figure 12:
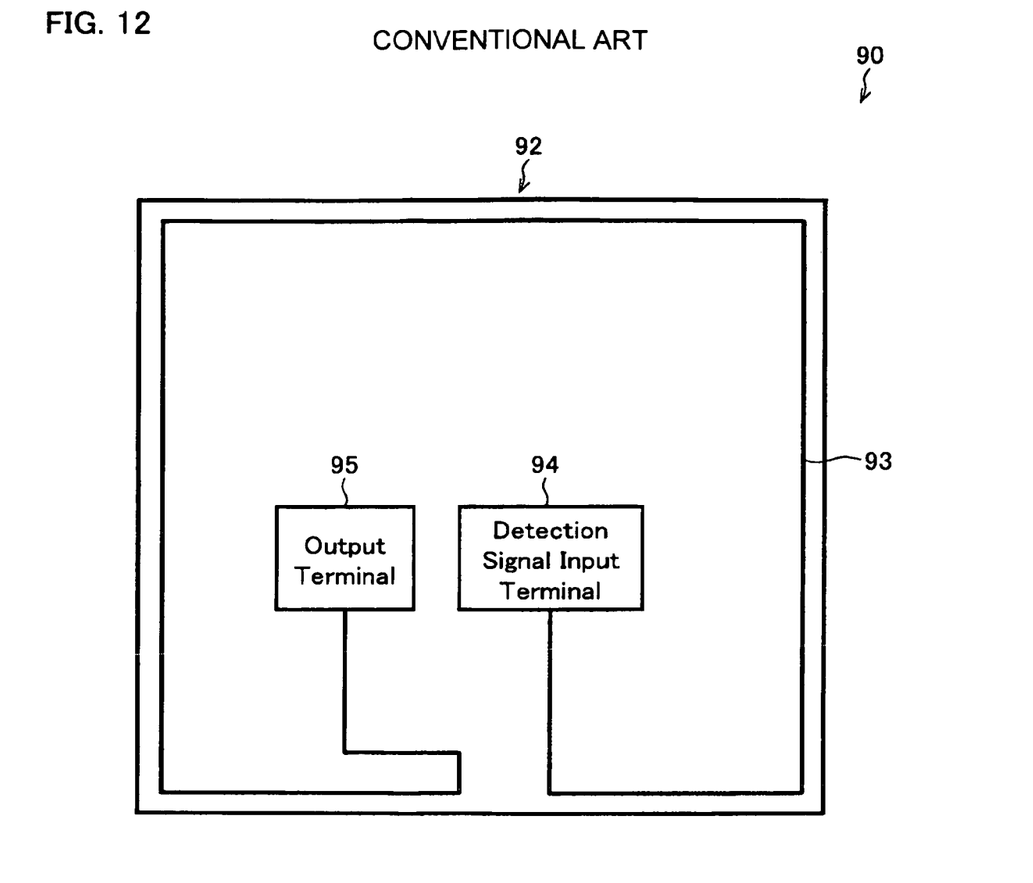
FIG. 12 A block diagram of the conventional semiconductor device.

FIG. 12 is a block diagram of a conventional semiconductor device 90. A semiconductor device 90 includes a semiconductor chip 92. An electric line 93 is formed along the periphery of the semiconductor chip 92 for damage detection. An end of the electric line 93 is provided with a detection signal input terminal 94 to which is supplied a detection signal with which a break in the electric line 93 is detected. The other end of the electric line 93 is provided with an output terminal 95 from which the detection signal having passed through the electric line 93 is output.

As voltage is applied to the detection signal input terminal 94, electric current having passed through the electric line 93 is detected at the output terminal 95. If the semiconductor chip 92 is damaged and the electric line 93 is broken, no current is detected at the output terminal 95, which enables detection of damage to the semiconductor chip 92.

Patent document 2, as an example, discloses a similar chip damage detection method. According to the method, an electric line is formed along the periphery of the chip, and damage detection probe pads are formed on both ends of the line. However, the structure requires the provision of the two new measurement terminals to detect damage to the peripheral part of the chip. The increased chip area presents a new problem.

Some documents disclose chip damage detection structures which require no new measurement terminals. Patent document 3 discloses a structure in which only one detection terminal is needed. Meanwhile, patent document 4 discloses a structure in which a wire is connected to an existent terminal via an internal circuit. The terminal is used for inspection only during testing. The structure hence needs no additional measurement terminals.

Patent documents 5 to 7 disclose chip heating technology using a circuit in a semiconductor device.

[Patent Document 1]
Japanese Unexamined Patent Publication No. 2000-138245 (Tokukai 2000-138245; published May 16, 2000)
[Patent Document 2]
Japanese Unexamined Patent Publication No. 7-193108/1995 (Tokukaihei 7-193108; published Jul. 28, 1995)
[Patent Document 3]
Japanese Unexamined Patent Publication No. 5-95039/1993 (Tokukaihei 5-95039; published Apr. 16, 1993)
[Patent Document 4]
Japanese Unexamined Patent Publication No. 2005-277338 (Tokukai 2005-277338; published Oct. 6, 2005)
[Patent Document 5]
Japanese Unexamined Patent Publication No. 2002-26232 (Tokukai 2002-26232; published Jan. 25, 2002)
[Patent Document 6]
Japanese Unexamined Patent Publication No. 6-97245/1994 (Tokukaihei 6-97245; published Apr. 8, 1994)
[Patent Document 7]
Japanese Unexamined Patent Publication No. 2005-172467 (Tokukai 2005-172467; published Jun. 30, 2005)
[Non-patent Document 1]
Wafer Level CSP by Masumoto, et al., Fujikura Technical Letter, page 77 to page 80, Issue 99, October 2000

DISCLOSURE OF INVENTION

The arrangements described in the prior art literature, however, has a problem. The inspection line could open up, but allow current to flow during inspection by contacting another wire of the internal circuit. Hence, although the line actually has a break, the inspection may indicate that the line has no break. For example, in the case of patent document 3, voltage is applied to a check pad to detect current through a transistor at the check pad. If no current flows, it is determined that there is a break. Therefore, when a line 2 is broken or deformed, if the line contacts another line of the internal circuit, there occurs a current flow from the check pad to the line of the internal circuit. Although the chip is actually damaged, allowing no current to flow through the discontinuity detection transistor, a current may be detected so that it is determined that the chip is not damaged.

The structure of patent document 4 has a function of switching the contact to a pad between an external line of the chip and an internal line of the chip. The structure requires no new measurement terminals for detection of damage to the chip. In inspection, however, two measurement terminals are needed. If two or more lines are provided for detailed analysis of damage to the peripheral part of the chip, there occurs a problem that a large number of inspection terminals are needed.

Furthermore, patent document 4 measures electric current by applying voltage. Patent document 3 detects damage to a chip by measuring resistance. For these reasons, both patent documents 4 and 3 need analog test. This is not convenient.

Figure 11:
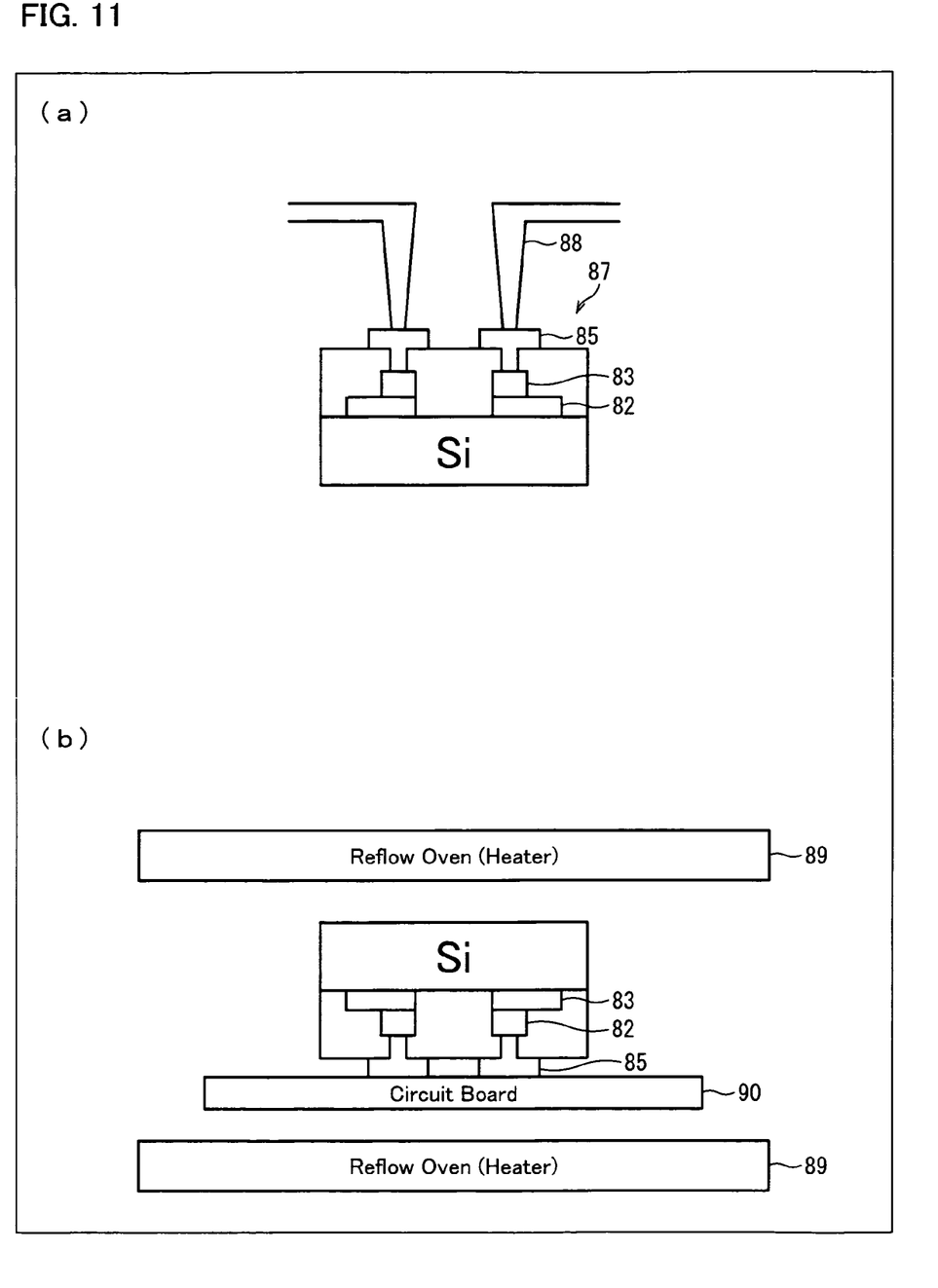
FIG. 11 Drawings illustrating a manufacturing method for wafer level CSPs: (a) to (b) showing individual steps.

After obtaining individual chips 87 by the aforementioned steps of wafer level CSP, the chips are individually tested with test probes 88 as shown in (a) of FIG. 11, subjected to reflow in the reflow oven 89 shown in (b) of FIG. 11, and mounted to a circuit board 90.

In mounting, the chips are heated at about 250° C. for a few seconds for reflow. The very small damage, not so large as to adversely affect the detection line, which has occurred in the dicing step illustrated in (e) of FIG. 10 may spread under thermal stress and affect the operation of the internal circuit of the chip.

The patent documents listed above fail to consider growth of damage under thermal stress and are unable to detect damage growing under thermal stress.

After dicing, the chips may be heated under similar conditions as in the reflow process to apply thermal stress and detect chips which would potentially develop a defect after the reflow. In wafer level CSP, however, the wafer is diced after solder balls are formed.

Therefore, if the chips are heated under similar conditions as in the reflow, the solder balls melt.

The present invention, conceived in view of the problems, has an objective of providing a semiconductor device which, without the provision of additional measurement terminals, enables easy logic test detection of damage to the chip and advance detection of a chip which would turn out to be defective when mounted to a circuit board.

A semiconductor device in accordance with the present invention is, to address the problems, characterized in that it includes: a wire formed along an outer periphery of a semiconductor chip to detect damage; a detection circuit provided in the semiconductor chip to supply a detection signal to the wire to detect a break in the wire; and an output terminal for outputting the detection signal having passed through the wire.

With these features, a detection signal with which a break is detected in the wire formed along an outer periphery of the semiconductor chip for damage detection is supplied from the detection circuit provided in the semiconductor chip to the wire. The detection signal having passed through the wire is output from the output terminal. Therefore, damage to the peripheral part of the chip is detectable using only one output terminal.

The semiconductor device in accordance with the present invention preferably further includes an output switching circuit selecting either an output signal of an internal circuit provided in the semiconductor chip or the detection signal having passed through the wire for outputting to the output terminal.

The configuration enables the existent output terminal for the internal circuit to double as an output terminal for outputting the detection signal with which a break in the wire is detected. That eliminates the need to provide a new output terminal for outputting the detection signal. The configuration keeps the chip area to the possible minimum, making the semiconductor device more compact.

The semiconductor device in accordance with the present invention is preferably such that the detection signal supplied from the detection circuit to the wire has ground and power supply potentials.

In the configuration, the detection signal is a pulse signal having ground and power supply potentials. Damage to the semiconductor chip can be detected by logic test in which only potentials need to be detected.

The semiconductor device in accordance with the present invention is preferably such that: the detection signal is a pulse signal; and the detection circuit supplies the pulse signal to the wire in test mode.

In the configuration, the pulse signal is supplied to the wire when in test mode. Damage to the semiconductor chip can be detected in terms of the presence/absence of an output pulse signal from the wire.

The semiconductor device in accordance with the present invention is preferably such that the output switching circuit selects the detection signal in test mode for outputting to the output terminal.

In the configuration, the detection signal is selected for output to the output terminal in test mode, and the output signal from the internal circuit is selected for output to the output terminal in ordinary operation mode. The single output terminal can be used both in ordinary operation mode and in test mode.

The semiconductor device in accordance with the present invention is preferably such that the internal circuit has at least one of a pull-up resistor, a pull-down resistor, an ON transistor, and an OFF transistor.

With the configuration, chip damage is reliably detected when there occurs a wire break. Malfunction of the output terminal is also prevented.

The semiconductor device in accordance with the present invention preferably further includes an inner peripheral line, disposed along an inner periphery of the wire, which has either a ground electrode or a power supply electrode.

In the configuration, if the semiconductor chip deforms, the inspection line contacts the inner peripheral line; no inspection signal is output. Hence, the deformation of the semiconductor chip is detected.

The semiconductor device in accordance with the present invention preferably further includes thermal stress application means for applying thermal stress to the semiconductor chip.

In the configuration, if the semiconductor chip has very small cracks, the cracks grow due to the application of thermal stress, causing the detection line to break or deform. The very small cracks, which may not be detectable by conventional methods, but can potentially develop into defects, are detectable as defects. If the chip has no such cracks, the detection line neither breaks nor deforms in the application of thermal stress; the chip is regarded as of good quality.

The semiconductor device in accordance with the present invention is preferably such that the thermal stress application means contains a heating element disposed along the wire and a power supply circuit supplying power to the heating element.

The configuration provides a thermal stress application means having a simple structure.

The semiconductor device in accordance with the present invention is preferably such that the heating element is made from a diffusion layer or polycrystalline silicon.

The configuration provides a heating element having a simple structure.

The semiconductor device in accordance with the present invention is preferably such that the heating element is disposed in parallel topology between a power supply line disposed along the outer periphery of the semiconductor chip and a ground wire disposed along the power supply line.

With the configuration, when the chip size increases, the heating element is still sufficiently powered, achieving stable heating.

The semiconductor device in accordance with the present invention is preferably such that the thermal stress application means further contains a temperature control circuit controlling the power supply to the heating element according to temperature of the semiconductor chip.

With the configuration, the temperature of the semiconductor chip can be set to any temperature.

The semiconductor device in accordance with the present invention preferably further includes a switching circuit connecting a power supply circuit provided to supply power to either an internal circuit provided in the semiconductor chip or the thermal stress application means.

The configuration eliminates the need to provide a new terminal for power supply to the thermal stress application means, thereby preventing increases in the chip area.

The semiconductor device in accordance with the present invention, as described in the foregoing, includes a detection circuit provided in the semiconductor chip to supply a detection signal to the wire for detection of a break in the wire. The configuration eliminates the need to provide two detection terminals as in conventional technology. The configuration does not add to the chip area, making the semiconductor device more compact. Furthermore, conventional technology needed separate analog test to detect a break, whereas the present invention detects a break readily by logic test.

The inclusion of the heating circuit enables concentrated heating in the peripheral part so as to avoid adversely affecting solder balls. In the subsequent damage detection, the chip that are likely to develop defects after reflowing are detected in advance.

REFERENCE NUMERALS

1 Semiconductor Device
2 Semiconductor Chip
3 Damage Inspection Line (Wire)
4 Detection Circuit
5 Output Terminal
6 Internal Circuit
7 Output Switching Circuit
8 Inner Peripheral Line
9 Damage Portion of Chip
10 Buffer
11 Register
12 Interface
13 Inverter
14 Resistor
15a, 15b Heating Element (Thermal Stress Application Means)
16 Power Supply (Thermal Stress Application Means, Power Supply Circuit)
17 Temperature Detection/control Circuit (Thermal Stress Application Means, Temperature Control Circuit)
18 Power Supply Line
19 Ground Wire

BEST MODE FOR CARRYING OUT INVENTION

The following will describe an embodiment of the present invention in reference to FIGS. 1 to 9.

Embodiment 1

Figure 1:
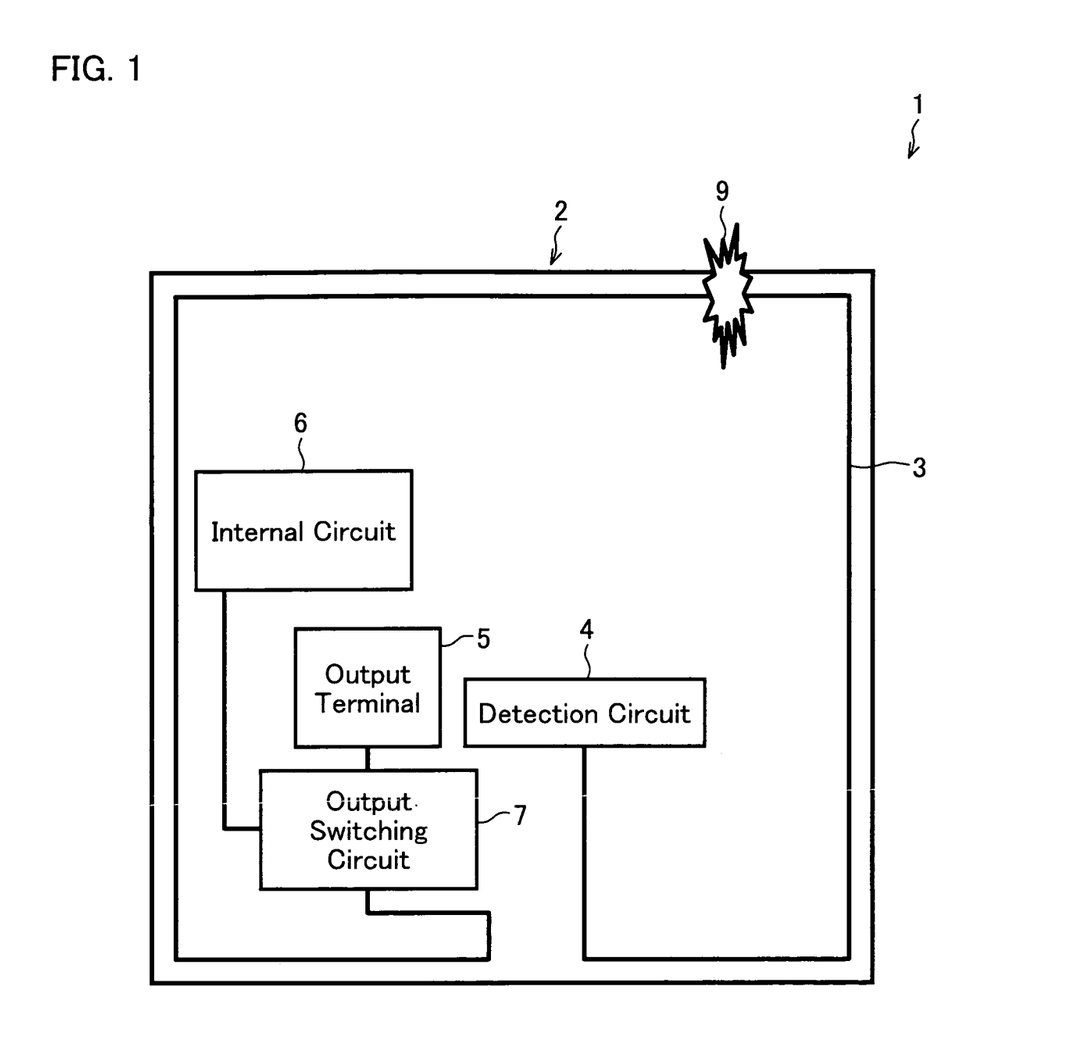
FIG. 1 A block diagram of a semiconductor device in accordance with embodiment 1.

FIG. 1 is a block diagram of a semiconductor device 1 in accordance with embodiment 1. The semiconductor device 1 includes a semiconductor chip 2. A damage inspection line 3 is formed along the outer periphery of the semiconductor chip 2 to detect damage. A detection circuit 4 is provided at an end of the damage inspection line 3 to supply to the damage inspection line 3 a detection signal for detecting a break 9 in the damage inspection line 3. The detection signal supplied from the detection circuit 4 to the damage inspection line 3 is a pulse signal having ground and power supply potentials. The damage inspection line 3 may be made of metal, polycrystalline silicon, a diffusion layer, or any other material.

An output switching circuit 7 is provided at the other end of the damage inspection line 3. The output switching circuit 7 selects either an output signal from an internal circuit 6 or the detection signal having passed through the damage inspection line 3, for supply to an output terminal 5. In this manner, the output switching circuit 7, selectively connecting either to output signals for ordinary functions or to a chip damage detection result signal, is connected to the output terminal 5 which normally outputs chip function signals. The other end of the damage inspection line 3 is connected to the output switching circuit 7. Hence, the other end of the damage inspection line 3 is able to output a chip damage detection result during inspection. The configuration requires no new output terminals for the output of the damage detection result. The internal circuit 6 contains at least one of a pull-up resistor, a pull-down resistor, an ON transistor, and an OFF transistor.

Figure 2:
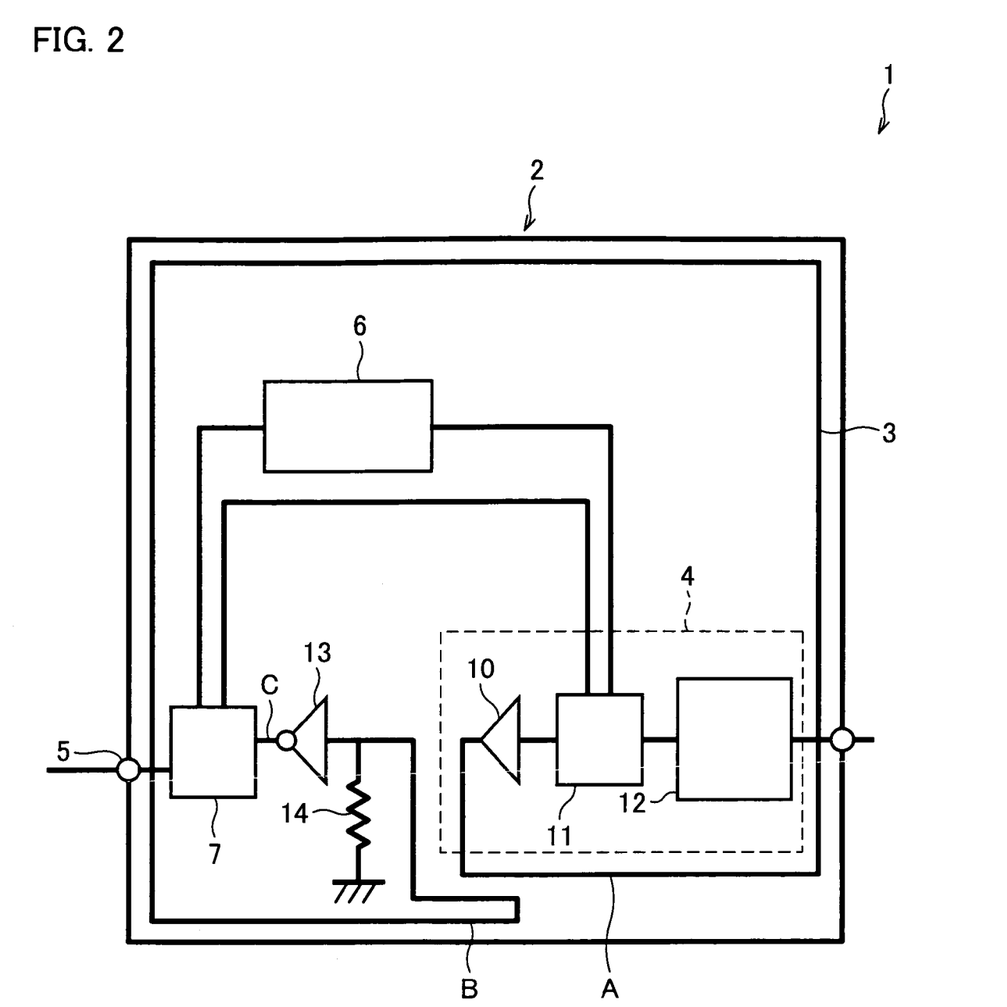
FIG. 2 A detailed block diagram of the semiconductor device.

FIG. 2 is a detailed block diagram of the semiconductor device 1. The detection circuit 4 includes a register 11 and a buffer 10 connected to the register 11. The buffer 10 is connected to an end of the line 3. The register 11 is connected to the internal circuit 6 and the output switching circuit 7. The semiconductor chip 2 has an interface 12 connected to the register 11. The interface 12 is an input/output circuit normally for IC control signals. The register 11 determines the operation of the internal circuit 6.

In testing, the interface 12 switches to test mode to supply a test signal. An inverter 13 is located between the other end of the damage inspection line 3 and the output switching circuit 7. Before the inverter 13, a resistor 14 is provided which is at an end connected to the inverter 13 and at the other end grounded.

In semiconductor chip 2 test mode, the interface 12 supplies a test signal. Output results at various terminals are analyzed to determine whether the chip 2 is good or defective. In the present embodiment, the test is carried out logically.

Considering only the detection of a break in the damage inspection line 3 provided to the semiconductor chip 2, the inspection may seem to require four terminals: a signal input terminal, a power supply terminal, a ground terminal, and an output terminal. The semiconductor chip inherently has a signal input terminal, a power supply terminal, and a ground terminal. There is also an existing output terminal which can be switched by the switching circuit 7 for that use. The present embodiment therefore requires no new terminals.

As detailed above, an end of the damage inspection line 3 is connected to the detection circuit 4. The line 3 is normally grounded and therefore at ground (LOW). In inspection, switching between power supply potential (HIGH) and ground (LOW) is followed by the output of the line 3 switching between HIGH and LOW. If the latter switching does not occur, it indicates that the line 3 is broken. Thus, damage to the peripheral part of the chip is detected. Since the inspection involves only the detection of potential, the inspection can be done by logic test.

Figure 3:
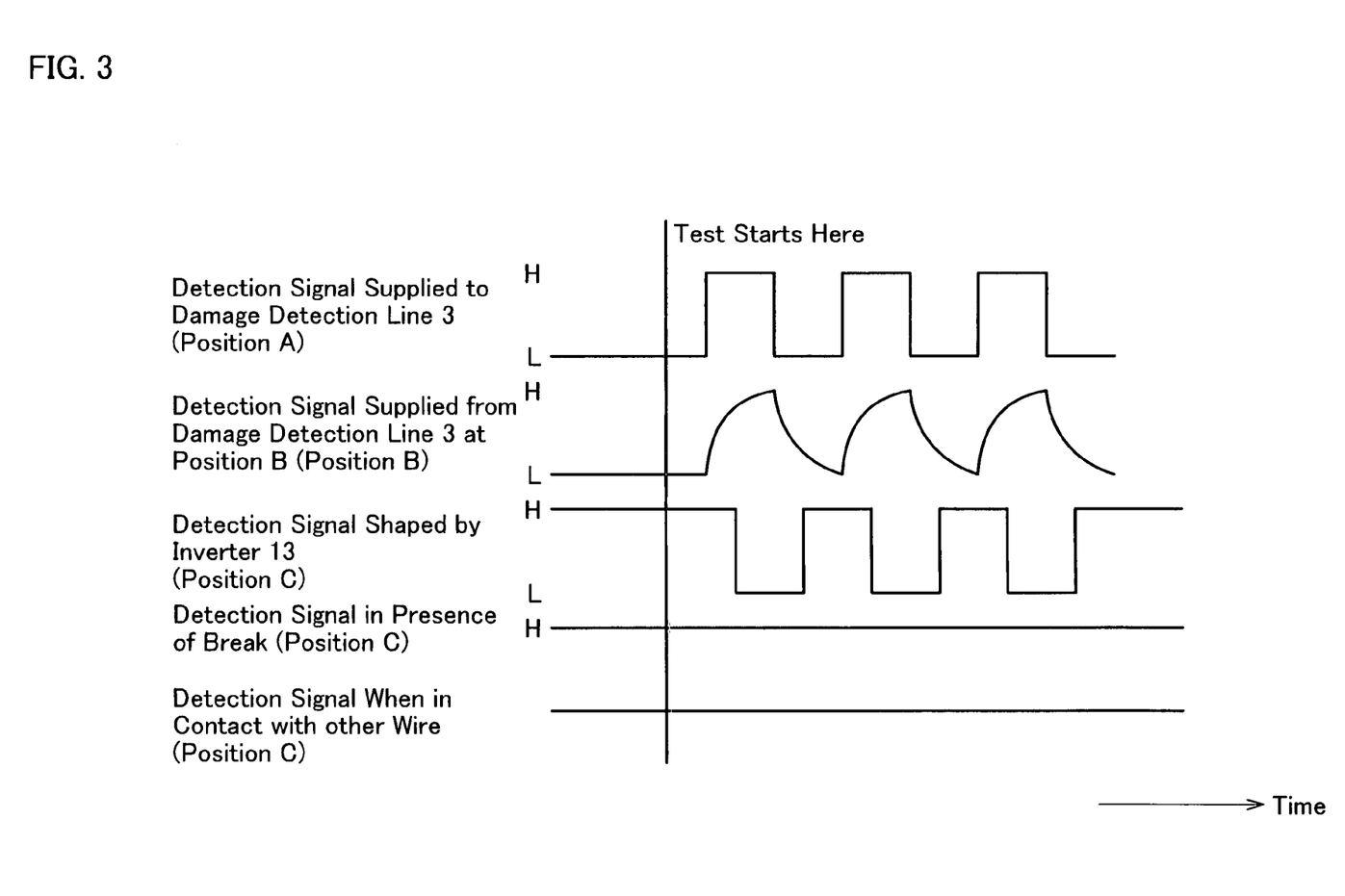
FIG. 3 Waveform diagrams for a detection signal supplied from a detection circuit in the semiconductor device.

FIG. 3 is a waveform diagrams for a detection signal supplied from the detection circuit 4. The detection signal, supplied from the detection circuit 4 to the damage inspection line 3 at position A, is a pulse signal having LOW (ground) and HIGH (power supply potential). The detection signal, when supplied from the damage inspection line 3 to the inverter 13 at position B, shows a delay and distortion caused by the damage inspection line 3. With the waveform being shaped by the inverter 13, the detection signal is supplied to the output switching circuit 7 at position C and output from the output terminal 5.

If the chip is not damaged, and the damage inspection line 3 is not broken, the detection signal, as it appears at position C after waveform shaping, is output from the output terminal 5. If the damage inspection line 3 has a break 9, a HIGH signal is output from the output terminal 5. If the damage inspection line 3 contacts another wire, a signal whose level is equal to the potential on that wire in contact is output from the output terminal 5.

Damage to the chip is thus detectable by logic test in which either HIGH or LOW potential is detected. No analog test which involves current measurement is needed.

Conventional technology regards that if the inspection line is broken, there is no output. However, if the inspection line is discontinued, but in contact with another internal wire or if the chip has deformed causing the inspection line to contact another wire, the voltage/current on a wire in the chip could be picked up, the inspection line is detected as having no break.

In view of these problems, in the present embodiment, the detection circuit 4 outputs power supply potential and ground potential alternately to the damage inspection line 3 so that the output terminal 5 can detect power supply potential and ground potential alternately. By this configuration, a discontinuity-free state is reliably detectable. Although the detection circuit 4 has the two potentials, if only one of the potentials is detected in the output from the output terminal 5, one can know that the semiconductor chip 2 is damaged or deformed. In the semiconductor chip of the present embodiment, the output terminal 5 is normally used as a voltage output terminal.

For these reasons, the present embodiment, as detailed above, provides a damage inspection line along the periphery of the semiconductor chip so that a fracture, a crack, and other like damage to the semiconductor chip can be easily detected through the detection of the connection state of the line. A feature of the configuration is that the device is switched, as part of logic test in an ordinary functionality test for the semiconductor IC chip, to break check test mode so as to determine the condition of the peripheral line with the detection section by supplying a signal to the line.

Conventional technology needed special, break-check test section. In contrast, the present embodiment, owing to the configuration, assigns part of the inherent logic functionality of the IC chip for the break test circuit, thereby eliminating the need for special break check terminals.

As described above, embodiment 1 is capable of detecting damage to the peripheral part of the chip by detecting a break in the damage inspection line 3.

A HIGH/LOW signal is supplied from the detection circuit 4 to the damage inspection line 3 to allow the signal to be picked up at the output terminal 5. A break in the damage inspection line 3 is hence reliably detectable.

This is due to the following reasons. If only either HIGH or LOW appears at the output terminal 5, one can determine either that damage to the peripheral part of the chip has broken the inspection line or that the inspection line is in contact with the power supply line or ground line of the internal circuit of the chip.

In addition, the defect is detectable in logic test. If the semiconductor chip requires only logic test, no additional, analog test needs to be performed. That makes the inspection simple. The test being considered takes a very short time that is ignorable when compared with the overall logic test time.

Furthermore, the particular configuration of the present embodiment requires the provision of only one damage detection terminal for one line in the detection of damage to the chip. Therefore, chip damage is detectable even when the semiconductor chip has a limited number of output terminals cannot accommodate a new terminal. In addition, if the chip does not operate as designed after being mounted to a circuit board, one can determine whether the abnormality is due to damage to the chip.

The semiconductor device in accordance with embodiment 1 is capable of readily detecting damage to the peripheral part of the chip in logic test without providing additional measurement terminals or pads.

The present embodiment is especially effective when used with wafer level CSPs that are vulnerable to mechanical impact because they do not structurally allow a protection film to be formed on the side faces. The test readily determines the chips with a fracture or crack. Potentially faulty chips are removed. That adds to the reliability of the product.

Embodiment 2

Figure 4:
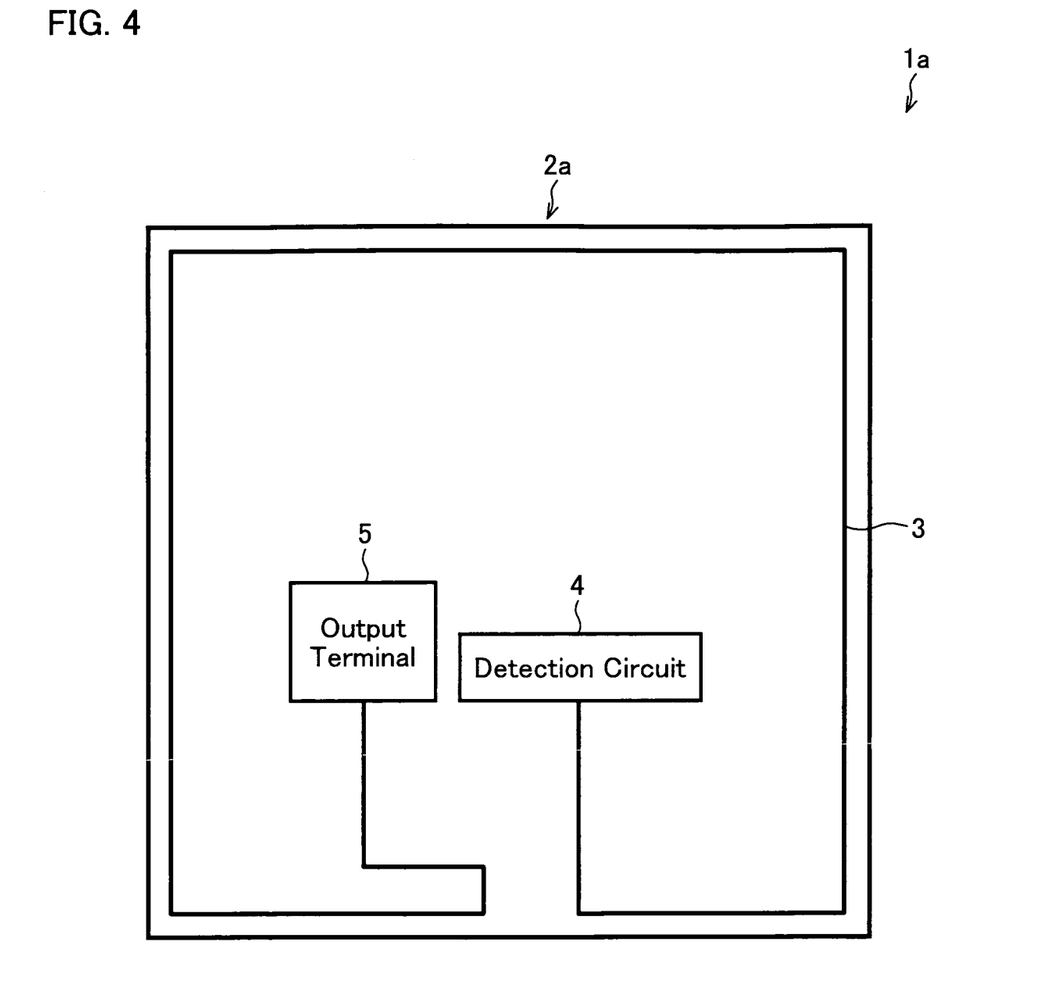
FIG. 4 A block diagram of a semiconductor device in accordance with embodiment 2.

FIG. 4 is a block diagram of a semiconductor device 1*a* in accordance with embodiment 2. Members of the present embodiment that have the same arrangement and function as the aforementioned members are indicated by the same reference numerals and description thereof is omitted.

The semiconductor device 1a includes a semiconductor chip 2a. A damage inspection line 3 is formed along the outer periphery of the semiconductor chip 2a to detect damage. A detection circuit 4 is provided at an end of the damage inspection line 3 to supply to the damage inspection line 3 a detection signal for detecting a break in the damage inspection line 3. The detection signal supplied from the detection circuit 4 to the damage inspection line 3 is a pulse signal having ground and power supply potentials. An output terminal 5 is provided at the other end of the damage inspection line 3. The detection signal, having passed through the damage inspection line 3, is output from the output terminal 5.

Unlike embodiment 1, the output terminal is provided separately from the output terminal of the internal circuit in embodiment 2. Still, damage to the chip is detectable by providing only one damage detection terminal for one line as in embodiment 1.

In addition, in the present embodiment, the provision of the break check circuit and line enables the break check to be performed as part of normal logic test. The process can not only determine whether there is a break or not, but also detect short-circuit and heat- and force-induced chip deformation.

Embodiment 3

Figure 5:
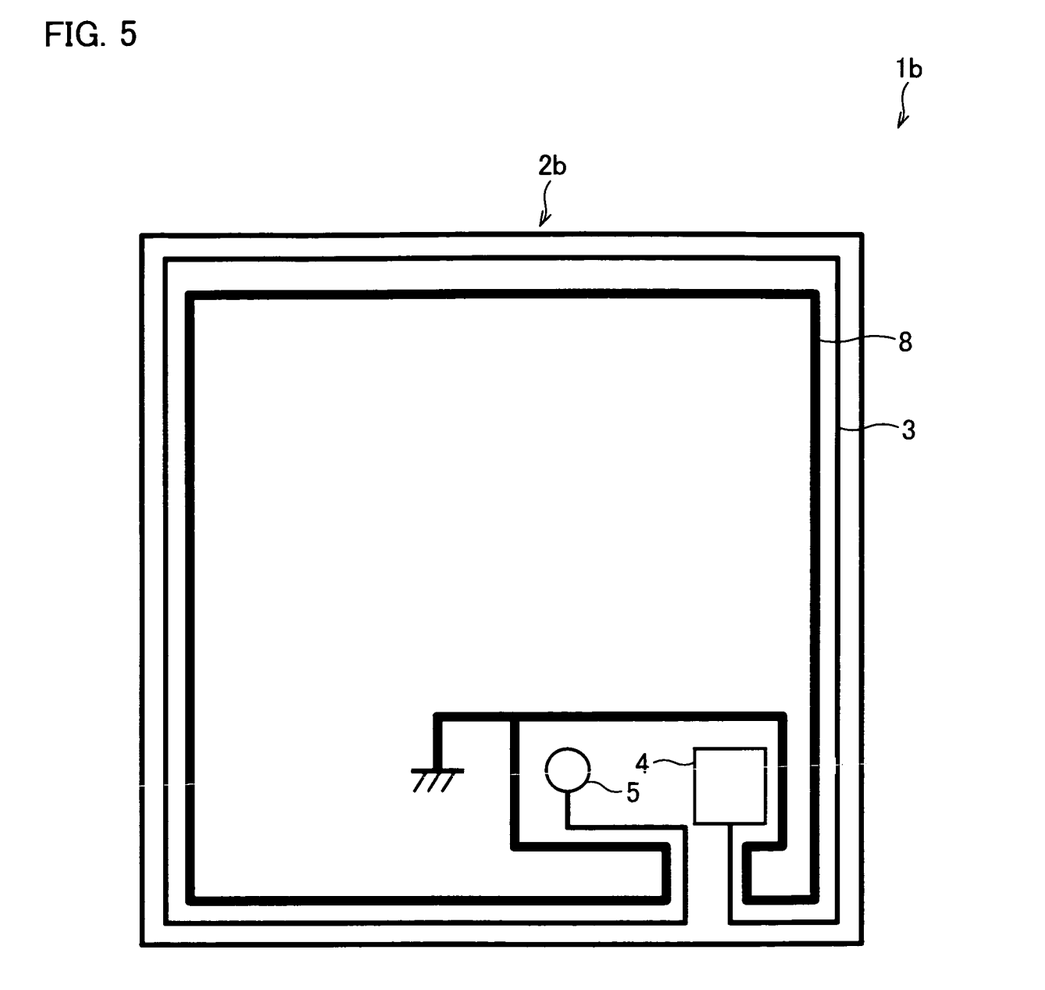
FIG. 5 A block diagram of a semiconductor device in accordance with embodiment 3.

FIG. 5 is a block diagram of a semiconductor device 1b in accordance with embodiment 3. The semiconductor device 1b includes a semiconductor chip 2b. A damage inspection line 3 is formed along the outer periphery of the semiconductor chip 2b to detect damage. A detection circuit 4 is provided at an end of the damage inspection line 3 to supply to the damage inspection line 3 a detection signal for detecting a break in the damage inspection line 3. The detection signal supplied from the detection circuit 4 to the damage inspection line 3 is a pulse signal having ground and power supply potentials. An output terminal 5 is provided at the other end of the damage inspection line 3. The detection signal, having passed through the damage inspection line 3, is output from the output terminal 5. In the semiconductor chip 2b, an inner peripheral line 8 is formed along the inner periphery of the damage inspection line 3. The line 8 is alternately at ground potential and at power supply potential.

Figure 6:
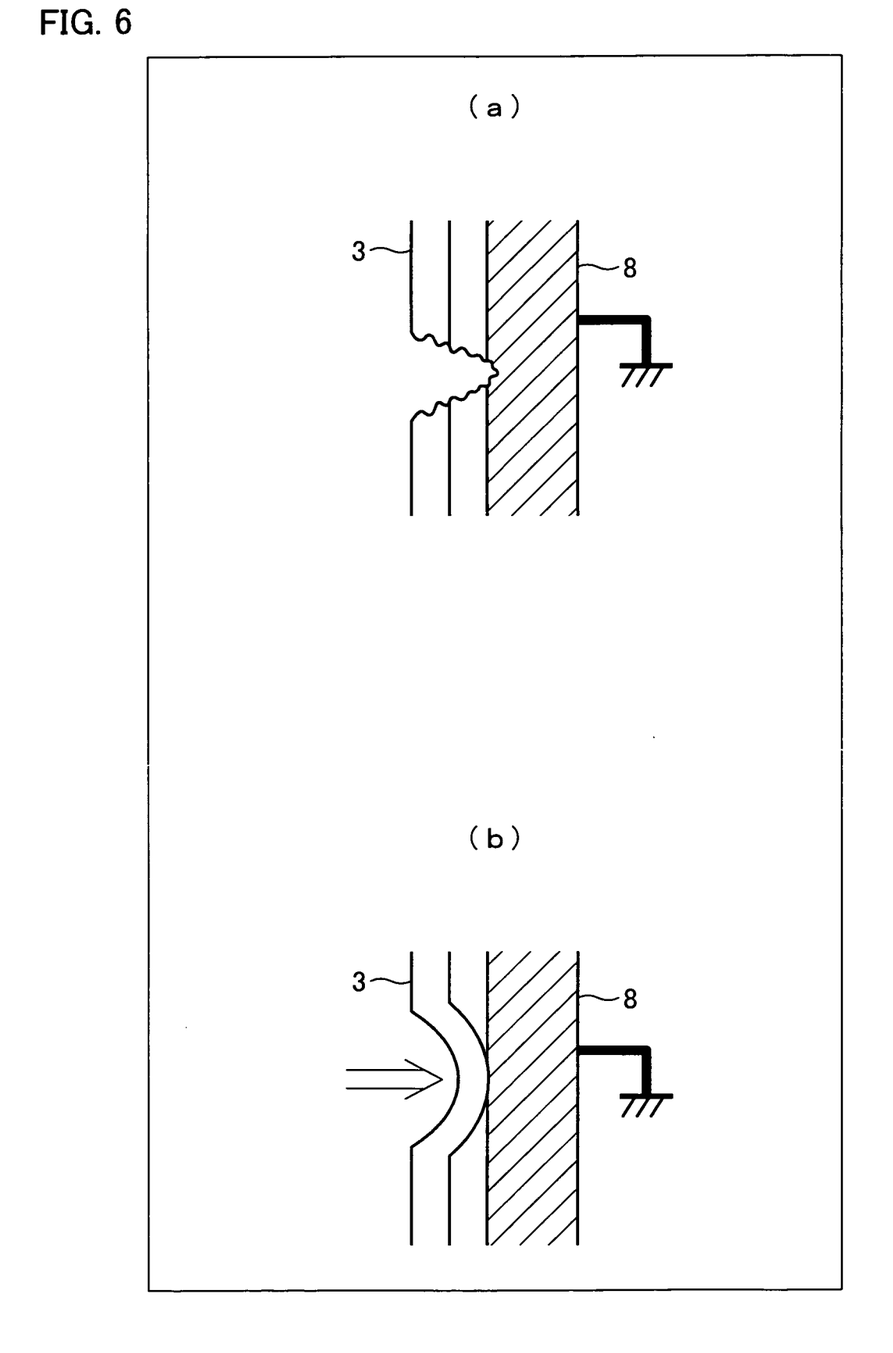
FIG. 6 Drawings illustrating a damage detection line for the semiconductor device: (a) showing the damage detection line when it is broken, (b) showing the damage detection line when it is deformed.

The semiconductor chip 2b of the present embodiment is adapted to detect short-circuit as well as a break. With the inner peripheral line 8 being disposed close and internal to the damage inspection line 3 and placed at ground or power supply potential, when the semiconductor chip 2 is deformed, the damage inspection line 3 contacts the inner peripheral line 8 as depicted in (b) of FIG. 6. Therefore, the inspect signal appears at the output terminal 5. Furthermore, as depicted in (a) of FIG. 6, when the damage inspection line 3 is broken, the inspect signal does not appear at the output terminal 5. The deformed semiconductor chip 2 and the broken damage inspection line 3 are both detectable in the test. The inner peripheral line 8 is formed by expanding the wire through which the internal circuit is grounded or connected to a power supply. The line 8 is made wide enough so that it does not break from a fracture or a crack.

This detection mechanism can distinguish between the unbroken damage inspection line, the broken damage inspection line contacting an inner wire, and the broken damage inspection line caused by chip deformation.

The determination on the presence/absence of a discontinuity is made reliable by supplying an arbitrary signal from the detection circuit and picking up a corresponding signal at the output terminal in test mode. Specifically, HIGH/LOW (power supply potential/ground) pulses are fed. Absence of a discontinuity is determined if it is verified in a test that the output has HIGH and LOW in a manner corresponding to the detection pulses.

When the inner peripheral line 8 for deformation detection is at ground potential, a break can be detected in the inspection simply by applying HIGH (LOW appears at the output terminal 5 even when the line 3 has a break or is in contact with the inner peripheral line 8).

If the inner peripheral line 8 is not at ground potential, but at HIGH, and HIGH is applied in the inspection, a simple break is detectable because LOW appears at the output terminal 5. In contrast, if the line 3 contacts the inner peripheral line 8 following a break or deformation of the line 3, HIGH appears at the output terminal 5, which is an indication of absence of a break.

If no inner peripheral line 8 is provided, the line 3 may possibly contact an internal circuit wire other than those for power supply and grounding. When this is the case, the signal on the wire in contact with the line 3 appears at the output terminal 5. As a matter of course, the detection signal needs to be different and distinguishable from the signals for the internal circuit.

Embodiment 4

Figure 7:
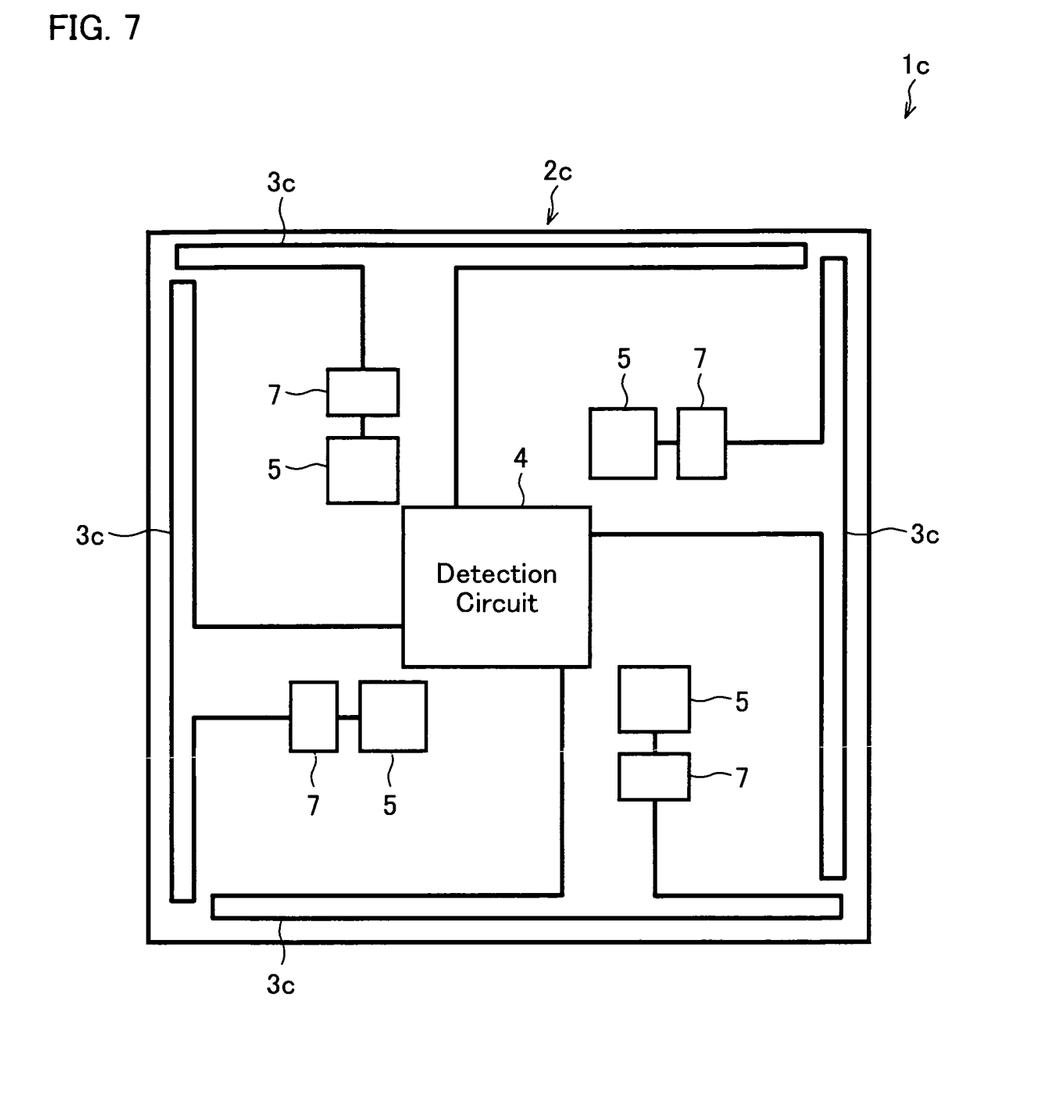
FIG. 7 A block diagram of a semiconductor device in accordance with embodiment 4

FIG. 7 is a block diagram of a semiconductor device 1c in accordance with embodiment 4. The semiconductor device 1c includes a semiconductor chip 2c. A total of four damage inspection lines 3c are formed for damage detection, one on each side of the semiconductor chip 2c. A detection circuit 4 is provided at the center of the semiconductor chip 2c and connected to an end of each damage inspection line 3c. The circuit 4 supplies to the damage inspection lines 3c a detection signal for detecting a break in the damage inspection lines 3c. The detection signal supplied from the detection circuit 4 to the damage inspection lines 3c is a pulse signal having ground and power supply potentials. The other ends of each damage inspection line 3c are individually connected to an output terminal 5 via an output switching circuit 7. The detection signal having passed through a damage inspection line 3c is output at the corresponding terminal 5.

The division of the periphery of the semiconductor chip into multiple parts and the provision of multiple damage inspection lines as above enables inspection which finds out which parts of the semiconductor chip are prone to damage. The inspection facilitates devising damage prevention measures. Four sides is not the only possibility; there may be provided as many lines as output terminals. Meanwhile, the single common detection circuit simultaneously supplies a detection signal to all the damage inspection lines; all the sides are simultaneously checked for a break.

Embodiment 5

Figure 8:
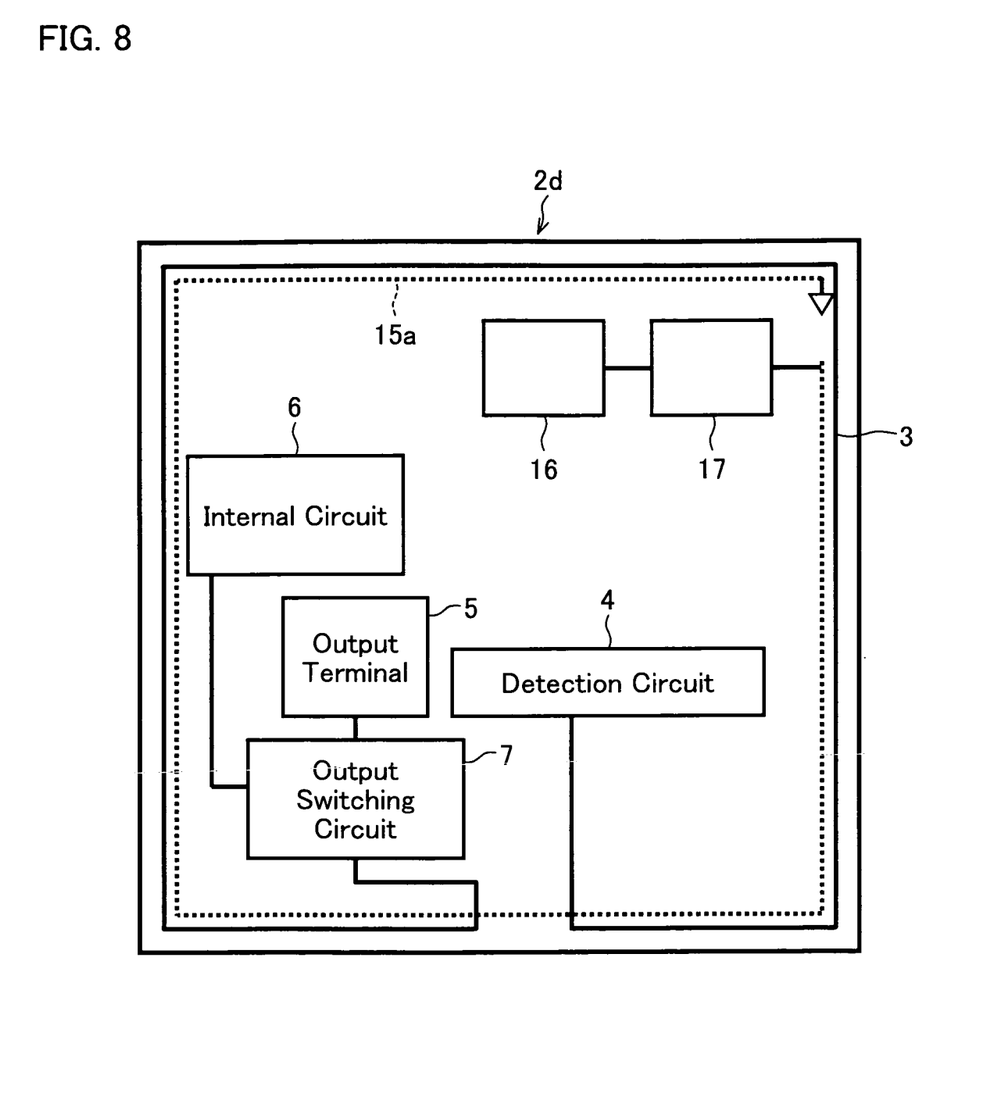
FIG. 8 A block diagram of a semiconductor device in accordance with embodiment 5.

FIG. 8 is a block diagram of a semiconductor device 2d in accordance with embodiment 5.

A heating element 15a is provided on the inner side of, or beneath, the damage inspection line 3. The element 15a is shown in the figure on the inner side of the line 3 for the sake of convenience. If the damage inspection line 3 and the heating element 15a are made of the same material, the heating element 15a needs to be disposed on the inner side of the damage inspection line 3. The heating element 15a is preferably disposed as close to the outer periphery as possible because it is only the peripheral part that needs to be heated. The element 15a is therefore best disposed beneath the damage inspection line 3. When this is the case, the combination of materials for the damage inspection line 3 and the heating element 15a should be as follows: If the damage inspection line 3 is made of a metal, the heating element 15a is made from either a polycrystalline silicon or a diffusion layer. If the damage inspection line 3 is made of a polycrystalline silicon, the heating element 15a is made from a diffusion layer.

The heating element 15a is connected to a power supply circuit. There could be three options: (i) The power supply circuit may be the one provided for the internal circuit 6, and a switching circuit is provided to divert power to the heating element. (ii) An existing input terminal may be switched to act as a power supply terminal to supply power to the heating element. (iii) A new terminal may be provided to supply power to the heating element. The figure illustrates, as an example, a new terminal being provided for the power supply. Needless to say, it is desirable to switch an existing terminal to act as a power supply terminal by using a switching circuit, so as to avoid increasing the chip area.

A temperature detection/control circuit 17 is provided between the heating element 15a and the power supply circuit. The circuit 17 detects temperature changes by exploiting a temperature characteristic of a diode, a bipolar transistor, or a like element. The control circuit controls the power supply to the heating element to maintain temperature at a constant value. Alternatively, the control circuit controls the power supply to the heating element based on preferred presets.

The configuration selectively heats only the peripheral part in the test conducted on diced, individual semiconductor chips so that very small damage can grow under thermal stress. Thus, the configuration can set aside chips which would potentially develop a defect after the reflow.

In this embodiment, the heating circuit is added to the configuration of embodiment 1 for convenience of description. The heating circuit is however applicable to all embodiments 1 to 4.

Embodiment 6

Figure 9:
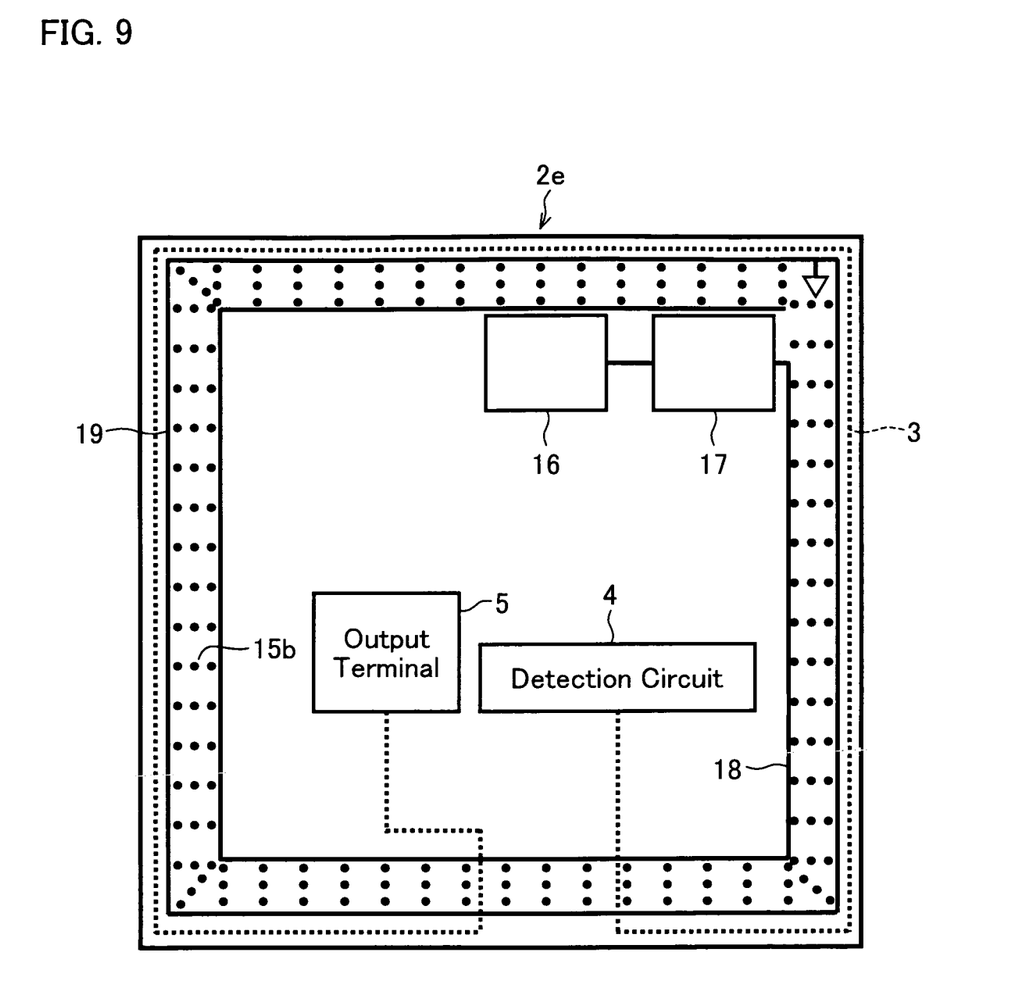
FIG. 9 A block diagram of a semiconductor device in accordance with embodiment 6.

FIG. 9 is a block diagram of a semiconductor device 2e of embodiment 6. The present embodiment is a variation of embodiment 5 on the way the heating element 15a is disposed. The configuration is otherwise the same. Detailed description and illustration of members other than the heating element(s) is omitted.

Heating elements 15b are provided on the inner side of, or beneath, the inspection line. The elements 15b are shown in the figure on the inner side of the line for the sake of convenience.

A power supply line 18 and a ground wire 19 are disposed along the periphery. The heating elements are provided between the line 18 and the wire 19 in a ladder-like geometry.

This particular layout of the heating elements, shown in FIG. 10, as a whole is represented by parallel topology as opposed to series topology for the heating element of embodiment 5. Even when the chip size increases, the heating elements are still sufficiently powered, achieving stable heating. The configuration is also applicable to all embodiments 1 to 4.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

Industrial Applicability

The present invention is applicable to semiconductor devices which have a function of detecting damage to the chip.

The invention clamied is:

1. A semiconductor device, comprising:
   a wire formed along an outer periphery of a semiconductor chip to detect damage;
   a detection circuit provided in the semiconductor chip to supply a detection signal to the wire to detect a break in the wire, the detection signal having ground and power supply potentials; and
   an output terminal for outputting the detection signal having passed through the wire.

2. The semiconductor device according to claim 1, further comprising:
   an internal circuit provided in the semiconductor chip; and
   an output switching circuit configured to select either an output signal of the internal circuit or the detection signal having passed through the wire for outputting to the output terminal.

3. The semiconductor device according to claim 2, wherein the output switching circuit is configured to select the detection signal in test mode for outputting to the output terminal.

4. The semiconductor device according to claim 2, wherein the internal circuit has at least one of a pull-up resistor, a pull-down resistor, an ON transistor, and an OFF transistor.

5. The semiconductor device according to claim 1, wherein:
   the detection signal is a pulse signal; and
   the detection circuit is configured to supply the pulse signal to the wire in test mode.

6. The semiconductor device according to claim 1, further comprising an inner peripheral line, disposed along an inner periphery of the wire, which is at either ground potential or power supply potential.

7. The semiconductor device according to claim 1, further comprising a thermal stress applicator for applying thermal stress to the semiconductor chip.

8. The semiconductor device according to claim 7, wherein the thermal stress applicator contains a heating element disposed along the wire and a power supply circuit supplying power to the heating element.

9. The semiconductor device according to claim 8, wherein the heating element is made from a diffusion layer or polycrystalline silicon.

10. The semiconductor device according to claim 8, wherein the heating element is disposed in parallel topology between a power supply line disposed along the outer periphery of the semiconductor chip and a ground wire disposed along the power supply line.

11. The semiconductor device according to claim 8, wherein the thermal stress applicator further contains a temperature control circuit controlling the power supply to the heating element according to temperature of the semiconductor chip.

12. The semiconductor device according to claim 7, further comprising a switching circuit configured to connect a power supply circuit provided to supply power to either an internal circuit provided in the semiconductor chip or the thermal stress applicator.

* * * * *